(12) United States Patent
Bian et al.

(10) Patent No.: US 11,837,851 B2
(45) Date of Patent: *Dec. 5, 2023

(54) CONFINING FEATURES FOR MODE SHAPING OF LASERS AND COUPLING WITH SILICON PHOTONIC COMPONENTS

(71) Applicant: GLOBALFOUNDRIES U.S. Inc., Santa Clara, CA (US)

(72) Inventors: Yusheng Bian, Ballston Lake, NY (US); Roderick A. Augur, Saratoga Springs, NY (US); Michal Rakowski, Ballston Spa, NY (US); Kenneth J. Giewont, Hopewell Junction, NY (US); Karen A. Nummy, Newburgh, NY (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/931,933

(22) Filed: Sep. 14, 2022

(65) Prior Publication Data

US 2023/0011972 A1    Jan. 12, 2023

Related U.S. Application Data

(63) Continuation of application No. 17/167,201, filed on Feb. 4, 2021, now Pat. No. 11,515,685.

(51) Int. Cl.
*H01S 5/00* (2006.01)
*H01S 5/20* (2006.01)
(Continued)

(52) U.S. Cl.
CPC .............. *H01S 5/2018* (2013.01); *H01S 5/20* (2013.01); *H01S 5/2231* (2013.01); *H01S 5/2232* (2013.01); *H01S 5/3013* (2013.01); *H01S 5/021* (2013.01); *H01S 5/026* (2013.01); *H01S 5/3054* (2013.01); *H01S 5/32333* (2013.01)

(58) Field of Classification Search
CPC ........ H01S 5/2018; H01S 5/20; H01S 5/2231; H01S 5/2232; H01S 5/3013; H01S 5/021; H01S 5/026; H01S 5/3054; H01S 5/32333
See application file for complete search history.

(56) References Cited

U.S. PATENT DOCUMENTS 10,340,659 B1 * 7/2019 Lin ..................... H01S 5/18394
11,515,685 B2 * 11/2022 Bian ..................... H01S 5/2018
(Continued)

OTHER PUBLICATIONS

Xie et al., "Metasurface-integrated vertical cavity surface-emitting lasers for programmable directional lasing emissions," Nature Nanotechnology, Feb. 2020.
(Continued)

*Primary Examiner* — Kinam Park
(74) *Attorney, Agent, or Firm* — Francois Pagette; Hoffman Warnick LLC

(57) ABSTRACT

A laser structure, including: a dielectric matrix formed of a first material; a laser source formed within the dielectric matrix and formed of a semiconductor material; and a
(Continued)

plurality of side confining features formed within the dielectric matrix and extending parallel to and along a length of the laser source. The plurality of side confining features are formed of the semiconductor material.

20 Claims, 15 Drawing Sheets

(51) Int. Cl.
  *H01S 5/30* (2006.01)
  *H01S 5/223* (2006.01)
  *H01S 5/026* (2006.01)
  *H01S 5/323* (2006.01)
  *H01S 5/02* (2006.01)

(56) References Cited

U.S. PATENT DOCUMENTS

| | | | |
|---|---|---|---|
| 2015/0030047 A1* | 1/2015 | Cheng | H01S 5/2018 372/50.1 |
| 2017/0160473 A1* | 6/2017 | Mazur | G02B 6/136 |
| 2019/0190235 A1* | 6/2019 | Ferreira Villares | H01S 5/34313 |

OTHER PUBLICATIONS

Yu et al., "Plasmonics for Laser Beam Shaping," IEEE Transactions on Nanotechnology, 9:11-29, Jan. 2010.

Bian et al., "3D Integrated Laser Attach Technology on 300-mm Monolithic Silicon Photonics Platform," IEEE Photonics Conference, WD4, 2020.

Nummy et al., "300-mm Monolithic Silicon Photonics Foundry Technology," IEEE Journal of Selected Topics in Quantum Electronics, Apr. 2019.

Li et al., "Study of lateral-drilled DBR fiber laser and its responsivity to external refractive index," Optics Express 9473, 2016.

Rakowski et al., "45nm CMOS—Silicon Photonics Monolithic Technology (45CLO) for next-generation, low power and high speed optical interconnects," Optical Fiber Communication Conference (OFC), T3H.3, 2020.

Bian et al., "Towards low-loss monolithic silicon and nitride photonic building blocks in state-of-the-art 300mm CMOS foundry," OSA Frontiers in optics/Laser science, FTu6E.3, 2020.

Notice of Allowance and Fee(s) Due dated Aug. 30, 2022 for U.S. Appl. No. 17/167,201, filed Feb. 4, 2021; pp. 11.

* cited by examiner

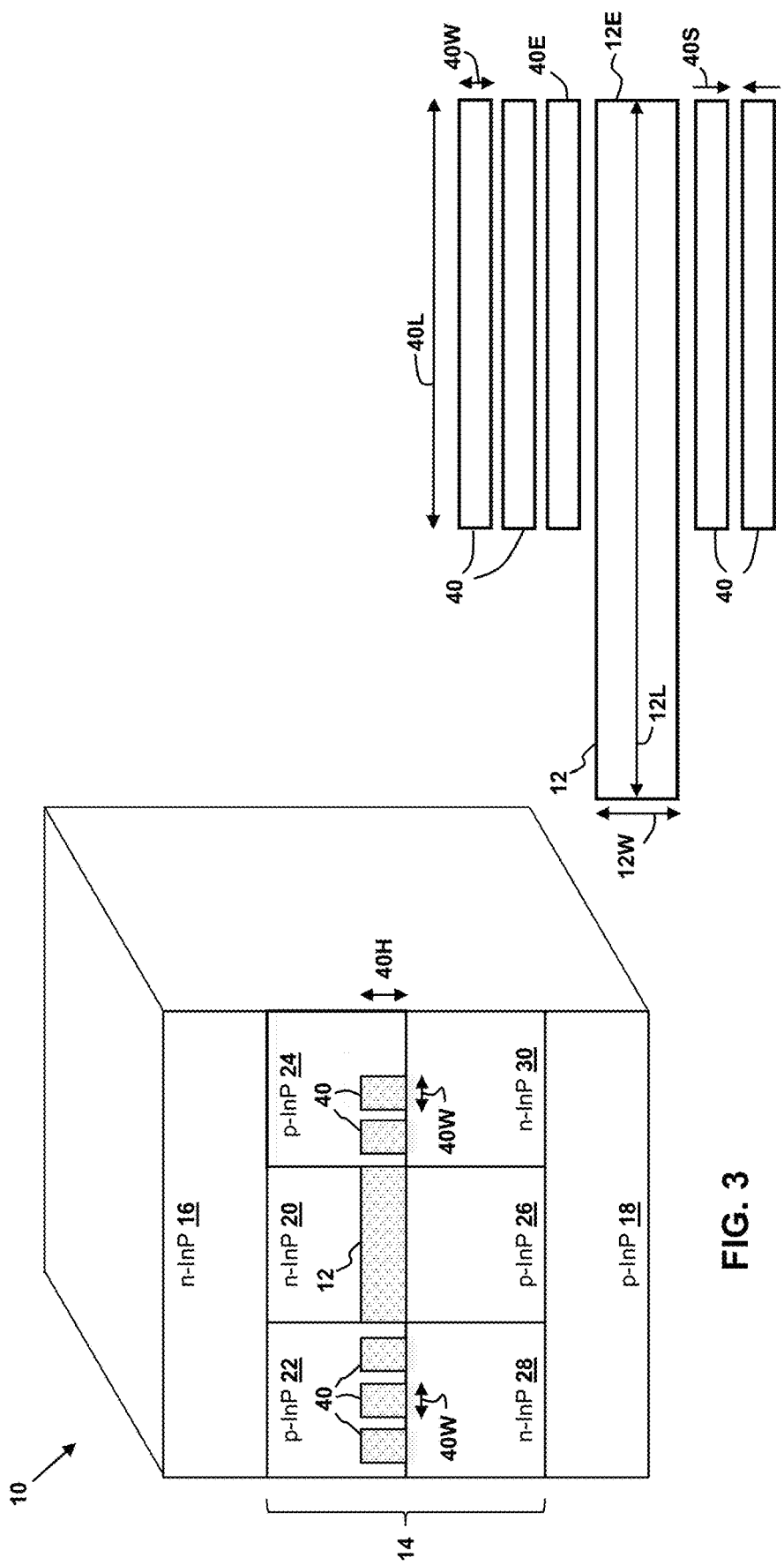

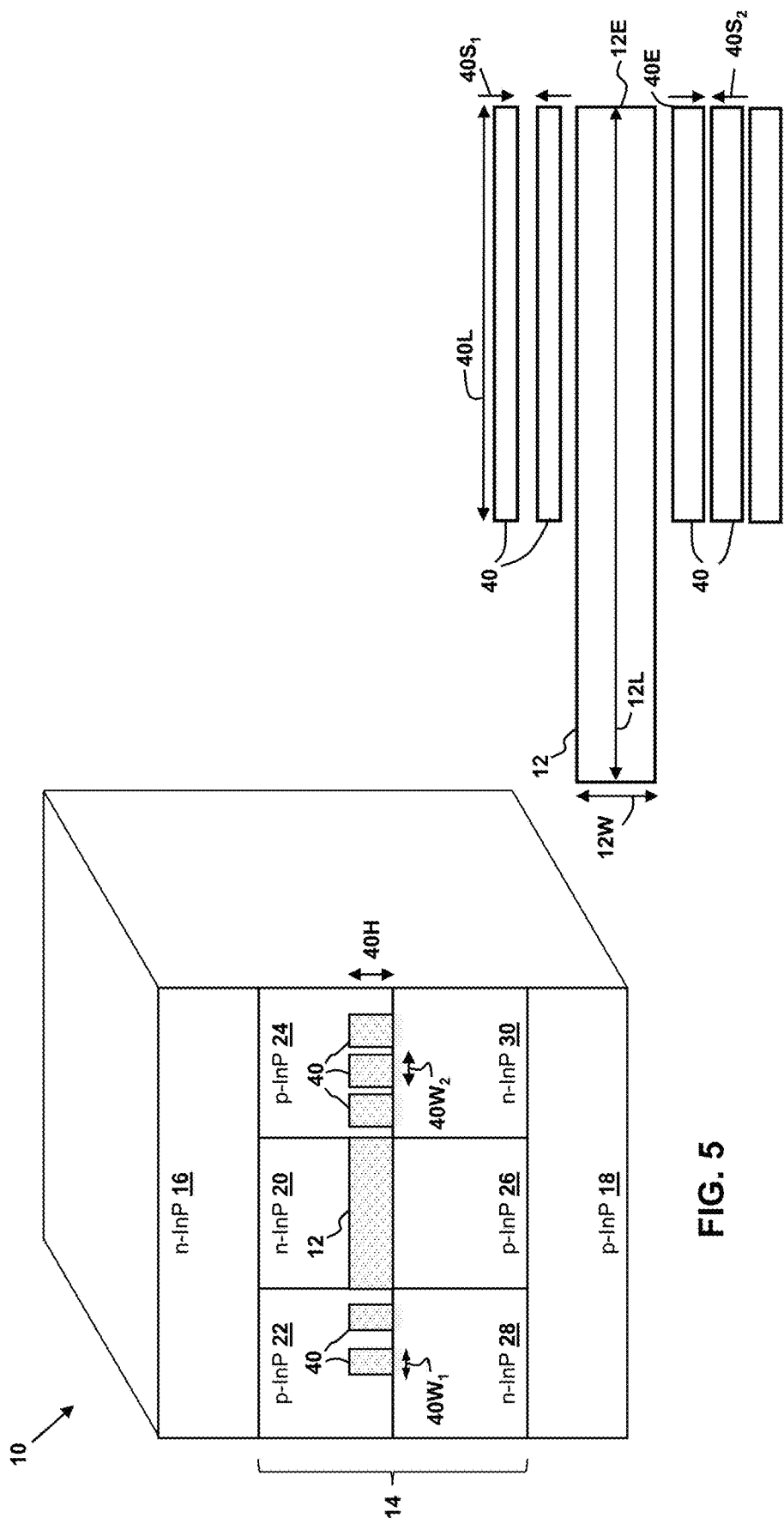

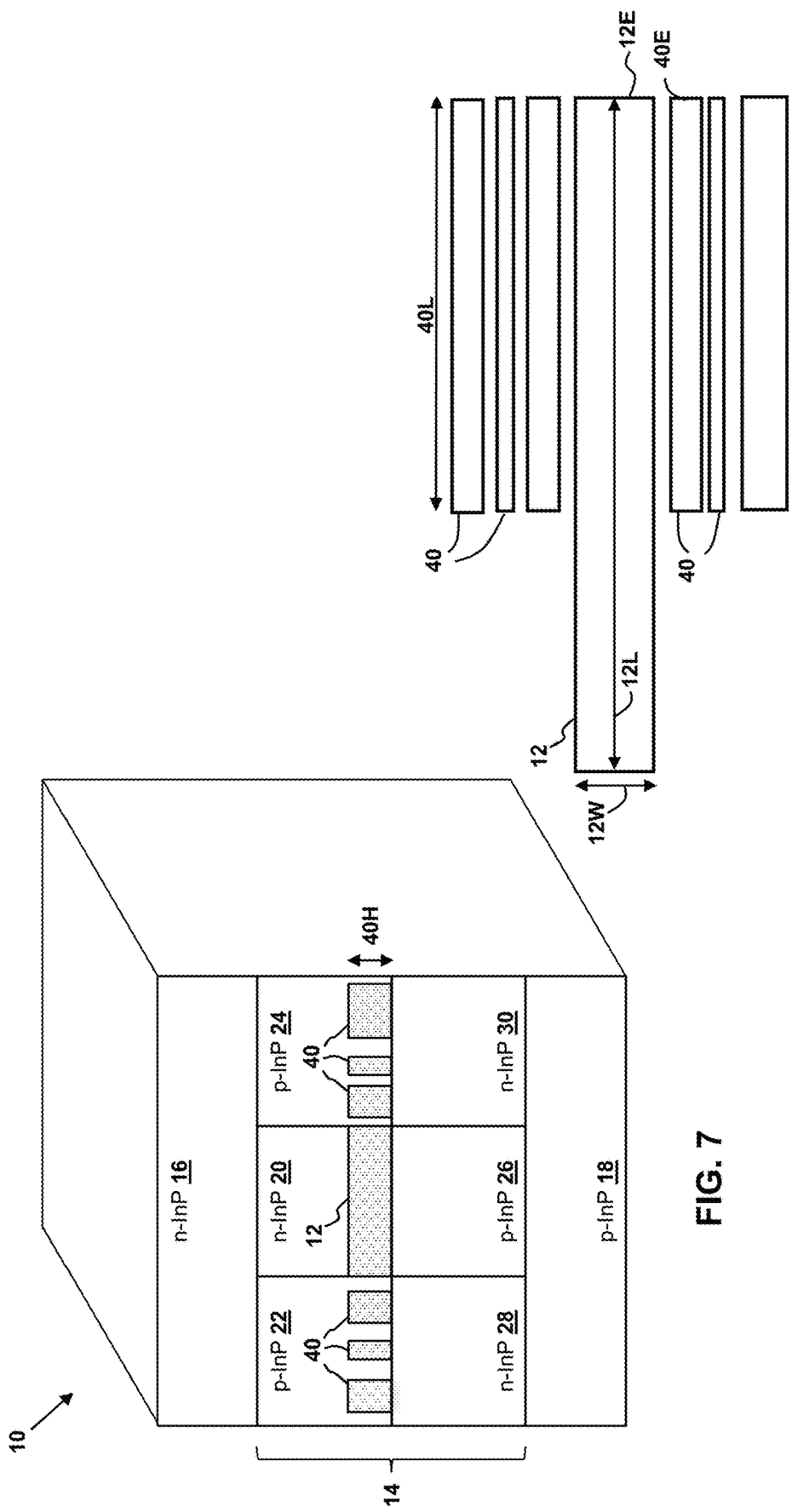

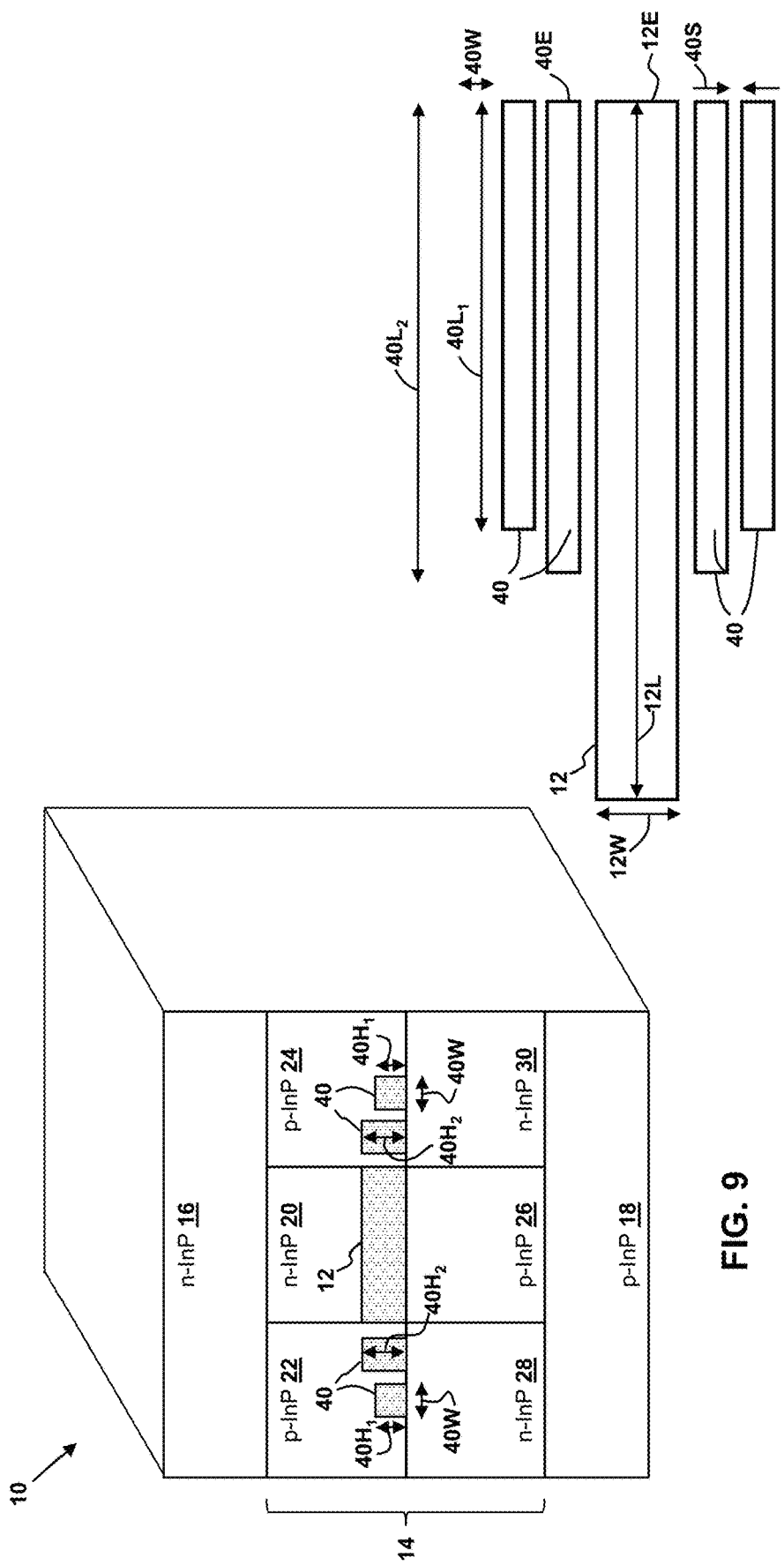

CONFINING FEATURES FOR MODE SHAPING OF LASERS AND COUPLING WITH SILICON PHOTONIC COMPONENTS

BACKGROUND

The present disclosure generally relates to photonic integrated circuits, and more particularly, to confining features for mode shaping of III-V lasers and enhanced coupling with silicon (Si) photonic components.

Silicon photonics is becoming a mainstream data-transmission solution for next-generation data centers, high-performance computers, and many emerging applications. Silicon-based photonic integrated circuits (PICs) offer the promise of low-cost and high-volume solutions for next-generation, high speed, energy-efficient optical interconnects. While remarkable advances have been achieved at both the component and system level, on-chip integration of low cost and power efficient laser sources (e.g., III-V semiconductor lasers) onto a silicon-based PIC remains a significant challenge. For example, efficient coupling between III-V semiconductor lasers and silicon photonic waveguides remains a significant issue due to the mode profile mismatch between III-V semiconductor lasers and silicon photonic waveguides.

SUMMARY

Generally, the present disclosure is directed to photonic integrated circuits, and more particularly, to confining features for mode shaping of III-V lasers and enhanced coupling with silicon (Si) photonic components. One illustrative laser structure disclosed herein includes: a dielectric matrix formed of a first material; a laser source formed within the dielectric matrix and formed of a semiconductor material; and a plurality of side confining features formed within the dielectric matrix and extending parallel to and along a length of the laser source, the plurality of side confining features formed of the semiconductor material.

Another illustrative laser structure disclosed herein includes: a dielectric matrix formed of a first material; a laser source formed within the dielectric matrix and comprising a semiconductor material; and a plurality of vertical confining features formed within the dielectric matrix and extending parallel to and along a length of the laser source, the plurality of vertical confining features comprising the semiconductor material.

An illustrative laser system disclosed herein includes: a laser source; and a waveguide optically coupled to the laser source, wherein the laser source comprises: a dielectric matrix formed of a first material; a laser source formed within the dielectric matrix and comprising a semiconductor material; and a plurality of confining features formed within the dielectric matrix and extending parallel to and along a length of the laser source, the plurality of confining features comprising the semiconductor material, wherein the plurality of confining features are formed on at least one of a side, top, or bottom of the laser source, and wherein the plurality of confining features are configured to adjust a size and profile of a mode of the laser source to match a mode of the waveguide.

BRIEF DESCRIPTION OF THE DRAWINGS

The disclosure may be understood by reference to the following description taken in conjunction with the accompanying drawings, in which like reference numerals identify like elements.

FIG. 3 depicts a cross-sectional view of another III-V semiconductor laser structure including side confining features according to various embodiments of the disclosure.

FIG. 4 is a plan view of the laser core and side confining features of FIG. 3 according to various embodiments of the disclosure.

FIG. 5 depicts a cross-sectional view of another III-V semiconductor laser structure including side confining features according to various embodiments of the disclosure.

FIG. 6 is a plan view of the laser core and side confining features of FIG. 5 according to various embodiments of the disclosure.

FIG. 7 depicts a cross-sectional view of another III-V semiconductor laser structure including side confining features according to various embodiments of the disclosure.

FIG. 8 is a plan view of the laser core and side confining features of FIG. 7 according to various embodiments of the disclosure.

FIG. 9 depicts a cross-sectional view of another III-V semiconductor laser structure including side confining features according to various embodiments of the disclosure.

FIG. 10 is a plan view of the laser core and side confining features of FIG. 9 according to various embodiments of the disclosure.

Figure 1:
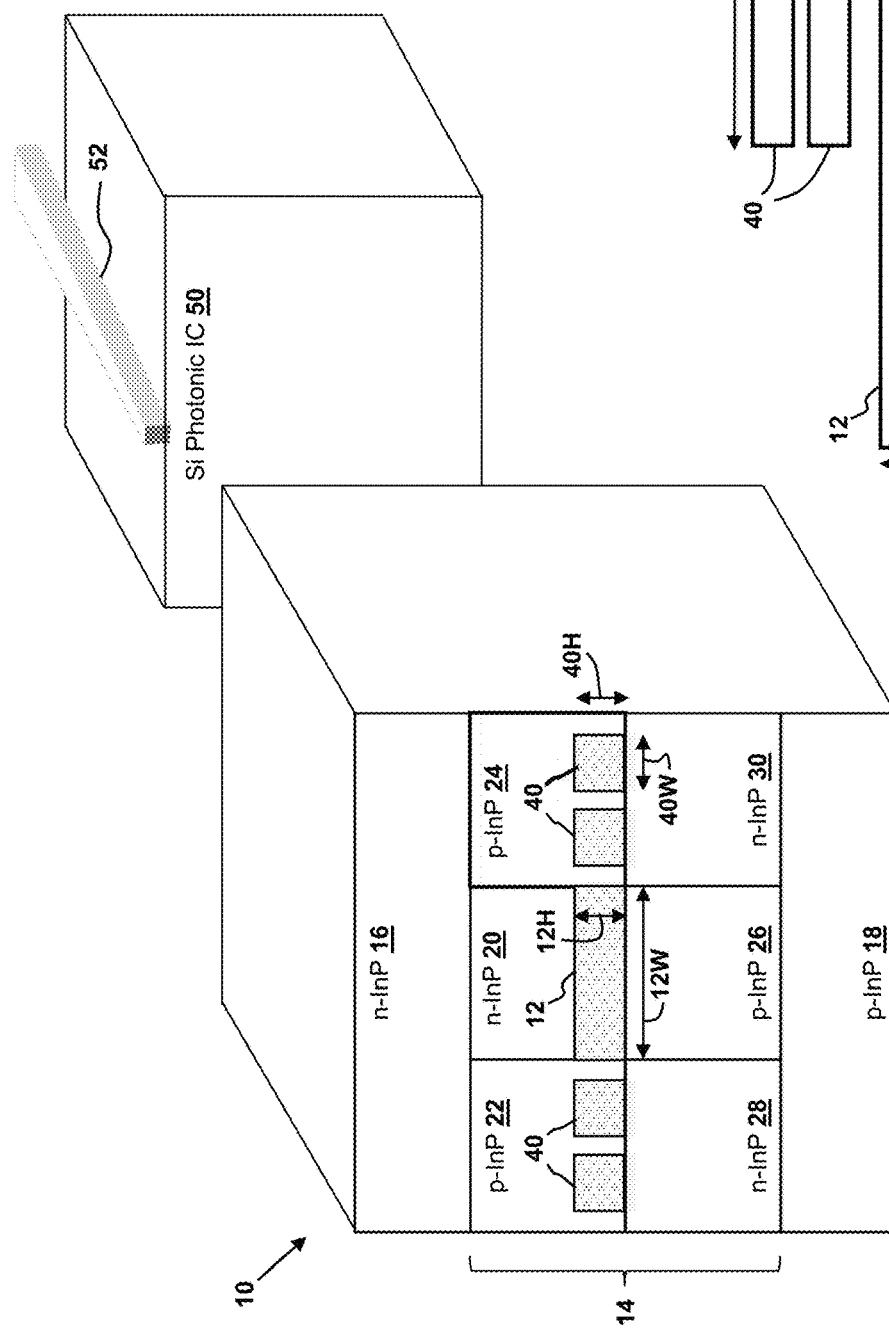
FIG. 1 depicts a cross-sectional view of a III-V semiconductor laser structure with symmetrically arranged side confining features according to various embodiments of the disclosure.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the disclosure to the particular forms disclosed, but on the contrary, the intention is to cover all modifications, equivalents, and alternatives falling within the spirit and scope of the disclosure as defined by the appended claims.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of a term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to III-V semiconductor lasers integrated with various configurations of side and/or vertical confining features. The laser core (lasing medium) and the confining features may be formed of III-V semiconductor materials with a high refractive index and may be embedded in a metamaterial (e.g., a dielectric matrix) having a refractive index lower than that of the laser core and confining features. The side and/or vertical confining features may be formed in symmetric and/or asymmetric configurations depending, for example, on the geometry and mode shape of the waveguide to which the laser core is coupled (e.g., a silicon (Si) inverse taper waveguide). The side and/or vertical confining features may be selected to adjust laser mode size and profile to reduce mode mismatch between III-V semiconductor lasers and waveguides, increasing coupling efficiency.

Referring now to FIG. 1, there is illustrated a cross-sectional view of a III-V semiconductor laser structure 10 (hereafter III-V laser 10) according to embodiments. As shown, the III-V laser 10 may include a laser core 12 formed of a III-V semiconductor material with a high refractive index (e.g., refractive index of >2.0) and embedded in a dielectric matrix 14 formed of a material having a refractive index that is lower than that of the laser core 12. According to embodiments, the laser core 12 may be formed of a III-V semiconductor material such as indium gallium arsenide phosphide (InGaAsP). Other suitable III-V semiconductor materials may also be used to form the laser core 12 including, for example, InCaAs, InCaASN, GaAsSb, AlGaAs, or GaAs. The dielectric matrix 14 may be formed of doped indium phosphide (InP) or other suitable materials (e.g., InAs and InSb).

The dielectric matrix 14 may be formed between n- and p-doped layers 16, 18 of InP or other suitable materials (e.g., InAs and InSb). The portion of the dielectric matrix 14 adjacent the n-doped layer 16 of InP may include an n-doped section 20 of InP formed between p-doped sections 22, 24 of InP. The portion of the dielectric matrix 14 adjacent the p-doped layer 18 of InP may include a p-doped section 26 of InP formed between n-doped sections 28, 30 of InP. N-type dopants may include but are not limited to; phosphorous (P), arsenic (As), antimony (Sb), and p-type dopants may include but are not limited to: boron (B), indium (In) and gallium (Ga).

According to embodiments, a set of one or more side confining features 40 may be formed adjacent the laser core 12. As shown in FIG. 1, for example, a plurality of symmetrically-arranged side confining features 40 may be formed laterally adjacent the laser core 12 in the p-doped sections 22, 24 of InP. According to embodiments, the side confining features 40 may be formed of the same high refractive index III-V semiconductor material as the laser core (e.g., InGaAsP). Other high refractive index III-V semiconductor materials such as InCaAs, InCaASN, GaAsSb, AlGaAs, or GaAs may also be used to form the side confining features 40. In some embodiments, the laser core 12 and the side confining features 40 may be formed of different III-V semiconductor materials. The plurality of symmetrically-arranged side confining features 40 formed in the p-doped sections 22, 24 of InP on each side of the laser core 12 may have the same pitch and duty cycle. The side confining features 40 may be formed at the same time as the laser core 12 and, according to embodiments, may have the same height 40H.

According to embodiments, the side confining features 40 (and other side confining features 40 described hereinbelow) may be configured to adjust the mode size and profile of the III-V laser 10 to reduce mode mismatch between the III-V laser 10 and a waveguide of a photonic integrated circuit. For example, as shown in FIG. 1, the side confining features may be configured for use with an inverse tapered Si waveguide 52 of a Si-based photonic integrated circuit 50.

Figure 2:
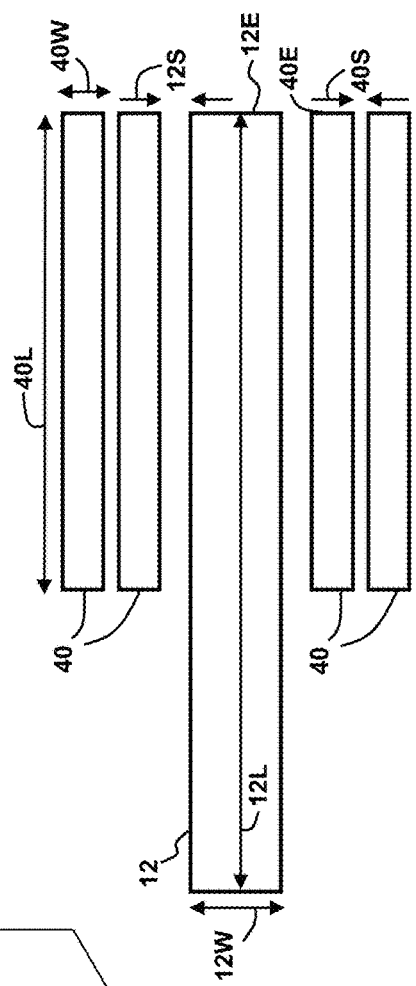
FIG. 2 is a plan view of the laser core and side confining features of FIG. 1 according to various embodiments of the disclosure.

A plan view of the side confining features 40 and the laser core 12 of FIG. 1 is depicted in FIG. 2. According to embodiments, referring to FIGS. 1 and 2, the side confining features 40 may be formed symmetrically on opposing sides of the laser core 12 in the p-doped sections 22, 24 of InP. The laser core 12 may have a width 12W of about 1 μm to about 5 μm and a height 12H of about 50 nm to about 300 nm. The side confining features 40 may have a height 40H of about 50 nm to about 300 nm and a width 40W of about 50 nm to about 1 μm. In general, the width 40W of the side confining features 40 is less than the width 12W of the laser core 12. The side confining features 40 in the p-doped sections 22, 24 of InP may be separated from each other by a distance 40S. The separation distance 40S between adjacent side confining features 40 may be about 50 nm to about 1 μm. The separation distance 12S between the laser core 12 and the adjacent side confining features 40 may be about 50 nm to 1 μm.

As depicted in FIG. 2, the side confining features 40 in the p-doped sections 22, 24 of InP may extend parallel to, and along a length of, the laser core 12 and may have a length 40L that is less than or equal to the length 12L of the laser core 12. In this embodiment and any of the other embodiments described herein as including side confining features 40, the distal end 12E of the laser core 12 may be aligned with the distal end 40E of each of the side confining features 40. This alignment ensures that the side confining features reshape the mode of the III-V laser 10 towards the end 12E of the gain layer (laser core 12). However, some slight offsets may be allowed in practice (e.g., the ends 40E of the side confining features 40 may be located slightly before or slightly after the end 12E of the laser core).

According to embodiments, the side confining features 40 may have a length 40L from about 10 µm to about 10 mm. In general, according to any of the embodiments including side confining features 40 described herein, the number and/or configuration (e.g., height, width, length) of the side confining features 40, and/or the placement of the side confining features 40 relative to the laser core 12 and relative to each other (e.g., separation distances 40S, 12S), may vary according to application and may be modified as necessary to address the mode mismatch between the III-V laser 10 and a waveguide or other component of a photonic integrated circuit.

Additional embodiments of the III-V laser 10 may include a set of one or more asymmetrically-arranged side confining features 40. For example, as depicted in FIGS. 3 and 4, the number of side confining features 40 formed on each side of the laser core 12 may vary. In this example, three side confining features 40 may be formed in the p-doped section 22 of InP, while two side confining features 40 may be been formed in the p-doped section 24 of InP, where all of the side confining features 40 may have the same height 40H, length 40L, width 40W, and separation distance 40S.

In other embodiments, the number, configuration, and/or placement of the side confining features 40 may vary on each side of the laser core 12. For example, in FIGS. 5 and 6, two side confining features 40 may be formed in the p-doped section 22 of InP, each having a height 40H, a first width 40W$_1$, and a first separation distance 40S$_1$, while three side confining features 40 may be formed in the p-doped section 24 of InP, each having a height 40H, a second width 40W$_2$, where 40W$_2$>40W$_1$, and a second separation distance 40S$_2$. In this example, the spacing 40S$_2$ between the side confining features 40 in the p-doped section 24 of InP may be different (e.g., smaller) than the spacing 40S$_1$ between the side confining features 40 in the p-doped section 22 of InP. To this extent, the asymmetrically-arranged side confining features 40 may be described as having a different pitch and duty cycle on each side of the laser core 12.

A further embodiment of the III-V laser 10 with an asymmetrical arrangement of side confining features 40 is depicted in FIGS. 7 and 8. As shown, the width and separation distances of the side confining features 40 in one or both of the p-doped sections 22, 24 of InP adjacent the laser core 12 may vary.

In the above-described embodiments, all of the side confining features 40 may have the same height 40H and length 40L. In other embodiments, however, as depicted in FIGS. 9 and 10, the side confining features 40 may have different heights and/or lengths. For example, one or more of the side confining features 40 in the p-doped sections 22, 24 of InP may have a height 40H$_1$ and length 40L$_1$, while one or more of the other side confining features 40 in the p-doped sections 22, 24 of InP may have a different height 40H$_2$ and length 40L$_2$.

Figure 11:
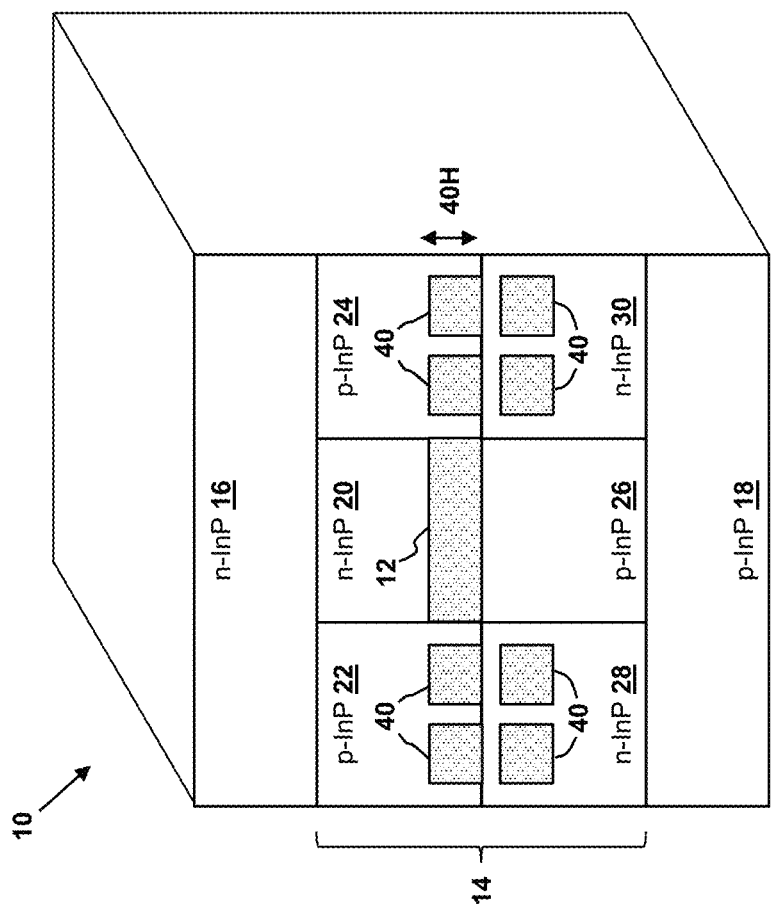
FIG. 11 depicts a cross-sectional view of another III-V semiconductor laser structure including side confining features according to various embodiments of the disclosure.

FIG. 11 depicts a III-V laser 10 with multi-layer side confining features 40 according to embodiments. For example, FIG. 11 depicts the III-V laser 10 of FIG. 1 with additional side confining features 40 formed in the n-doped sections 28, 30 of InP located below and to the sides of the laser core 12. As shown, the side confining features 40 formed in the n-doped sections 28, 30 of InP may have the same configuration/arrangement as the side confining features 40 formed in the p-doped sections 22, 24 of InP. However, in general, the side confining features 40 formed in the p-doped sections 22, 24 of InP and/or in the n-doped sections 28, 30 of InP may be configured/arranged in accordance with any of the embodiments described herein.

Figure 13:
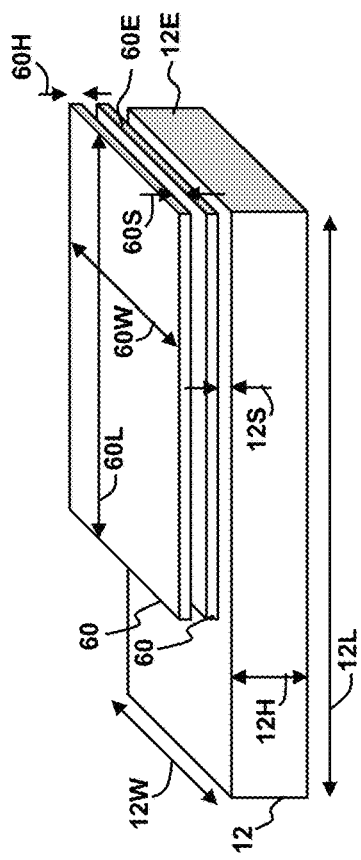
FIG. 13 is a side perspective view of the laser core and vertical confining features of FIG. 12 according to various embodiments of the disclosure.
Figure 12:
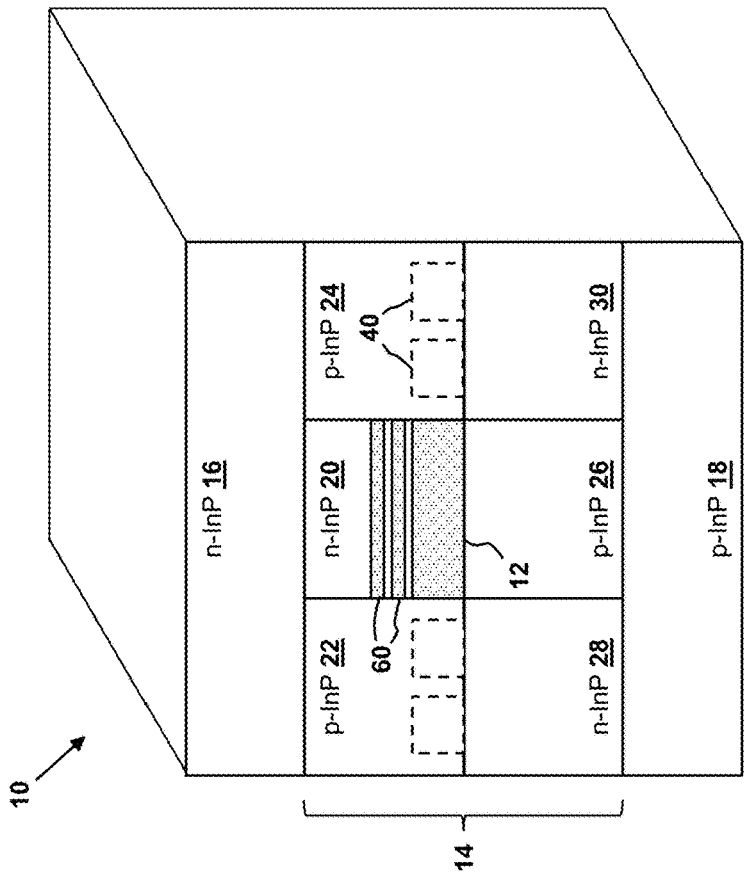
FIG. 12 depicts a cross-sectional view of a III-V semiconductor laser structure including vertical confining features according to various embodiments of the disclosure.
Figure 15:
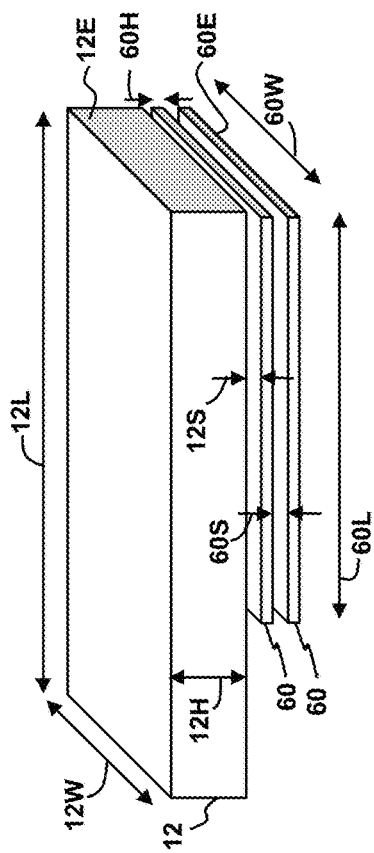
FIG. 15 is a side perspective view of the laser core and vertical confining features of FIG. 14 according to various embodiments of the disclosure.
Figure 14:
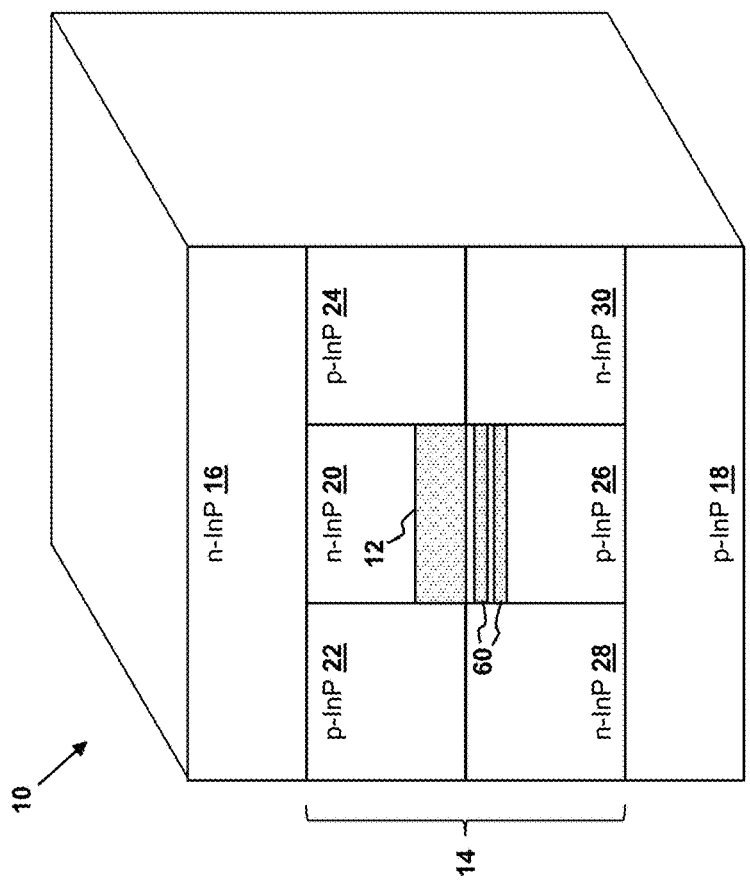
FIG. 14 depicts a cross-sectional view of another III-V semiconductor laser structure including vertical confining features according to various embodiments of the disclosure.

Referring to FIGS. 12 and 13, according to additional embodiments, the III-V laser 10 may include a set of one or more vertical confining features 60 formed adjacent (e.g., vertically above and/or below) the laser core 12. For example, FIGS. 12 and 13 depict an embodiment including a plurality of vertical confining features 60 formed directly above the laser core 12 in the n-doped section 20 of InP. As with the side confining features 40, the vertical confining features 60 may be formed of the same high refractive index semiconductor material as the laser core 12 (e.g., InGaAsP) or may be formed of other suitable high refractive index III-V semiconductor materials including, for example, InCaAs, InCaASN, GaAsSb, AlGaAs, or GaAs. In some embodiments, the laser core 12 and the vertical confining features 60 may be formed of different III-V semiconductor materials. The vertical confining features 60 may be formed at the same time as the laser core 12 and, according to embodiments, may have the same height 60H. In addition, the vertical confining features 60 may be used in conjunction with any of the embodiments of side confining features 40 described herein (e.g., as shown in phantom in FIG. 12) or may be used without side confining features 40.

A side view of the vertical confining features 60 and the laser core 12 of FIG. 12 is depicted in FIG. 13. According to embodiments, the laser core 12 may have a width 12W of about 1 µm to about 5 µm and a height 12H of about 50 nm to about 300 nm. The vertical confining features 60 may have a height 60H of about 5 nm to about 200 nm and a width 60W corresponding to (e.g., the same as) the width 12W of the laser core 12 (e.g., of about 50 nm to about 1 µm). In general, the height 60H of the vertical confining features 60 may be less than the height 12H of the laser core 12. As shown, the vertical confining features 60 may be separated by a distance 60S of about 5 nm to about 50 nm, which may be the same as or different than the separation distance 12S between the lower-most vertical confining feature 60 and the laser core 12. The separation distance 12S between laser core 12 and adjacent vertical confining feature 60 may be about 5 nm to about 50 nm. In some embodiments, the vertical confining features 60 may have different widths 60W or widths different than the width 12W of the laser core 12.

As depicted in FIG. 13, the vertical confining features 60 may extend parallel to, and along a length of, the laser core 12 and may have a length 60L that is less than or equal to the length 12L of the laser core 12. For example, according to embodiments, the vertical confining features 60 may have a length 60L from about 10 µm to about 10 mm. In this embodiment and any of the other embodiments described herein as including vertical confining features 60, the distal end 12E of the laser core 12 may be aligned with the distal end 60E of each of the vertical confining features 60. In general, according to any of the embodiments including vertical confining features 60 described herein, the number and/or configuration (e.g., height, width, length) of the vertical confining features 60, and/or the placement of the vertical confining features 60 relative to the laser core 12 and relative to each other (e.g., separation distances 60S, 12S), may vary according to application and may be modified as necessary to address the mode mismatch between the III-V laser 10 and the waveguide or other component of a photonic integrated circuit.

Figure 17:
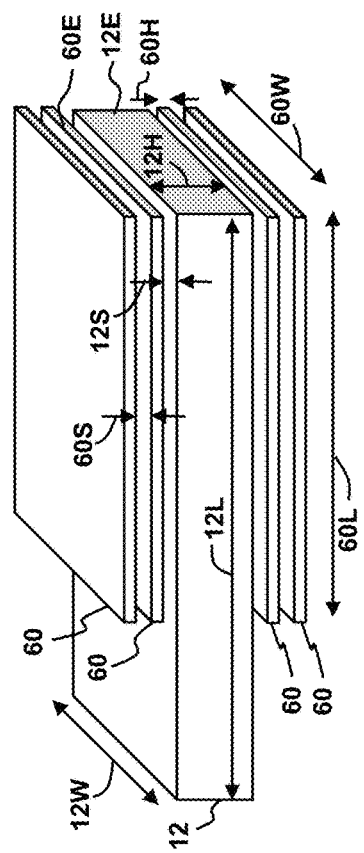
FIG. 17 is a side perspective view of the laser core and vertical confining features of FIG. 16 according to various embodiments of the disclosure.
Figure 16:
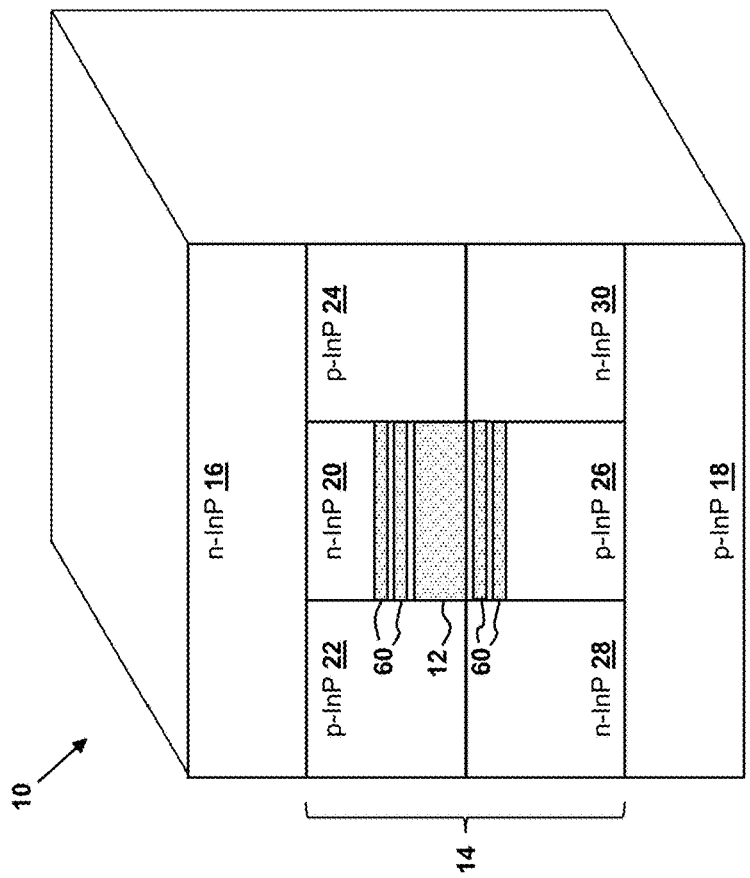
FIG. 16 depicts a cross-sectional view of another III-V semiconductor laser structure including vertical confining features according to various embodiments of the disclosure.

Additional embodiments of the III-V laser 10 with vertical confining features 60 are depicted in FIGS. 14-21. For example, in FIGS. 14 and 15, vertical confining features 60 with the same height 60H and width 60W may be formed in the p-doped section 26 of InP directly below the laser core 12, rather than in the n-doped section 20 directly above the laser core 12 as in FIGS. 12 and 13. Further, as depicted in FIGS. 16 and 17, a symmetrical arrangement of vertical confining features 60 with the same height 60H and width 60W may be formed both above and below the laser core 12 in the n-doped section 20 and p-doped section 26, respectively. In this symmetrical example, the vertical confining features 60 formed above and below the laser core 12 may have the same spacings 60S and 12S.

Figure 19:
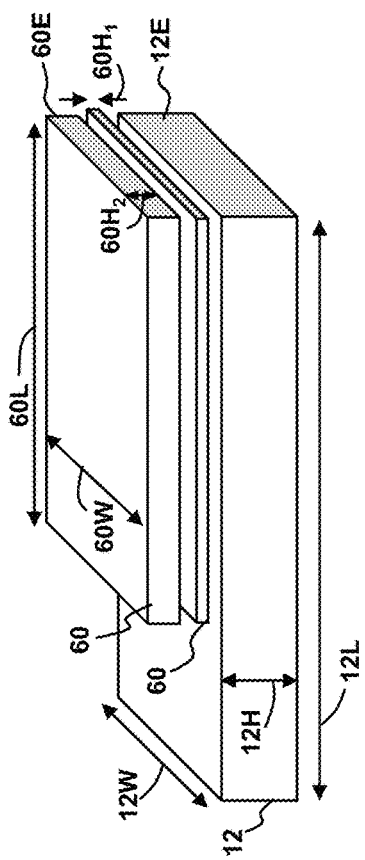
FIG. 19 is a side perspective view of the laser core and vertical confining features of FIG. 18 according to various embodiments of the disclosure.
Figure 18:
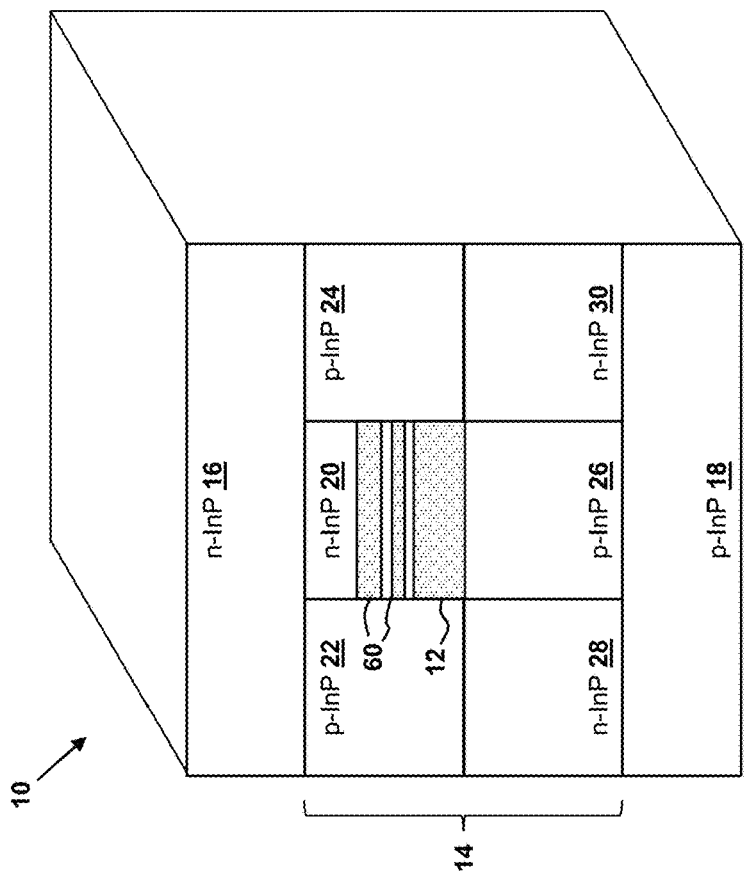
FIG. 18 depicts a cross-sectional view of another III-V semiconductor laser structure including vertical confining features according to various embodiments of the disclosure.
Figure 21:
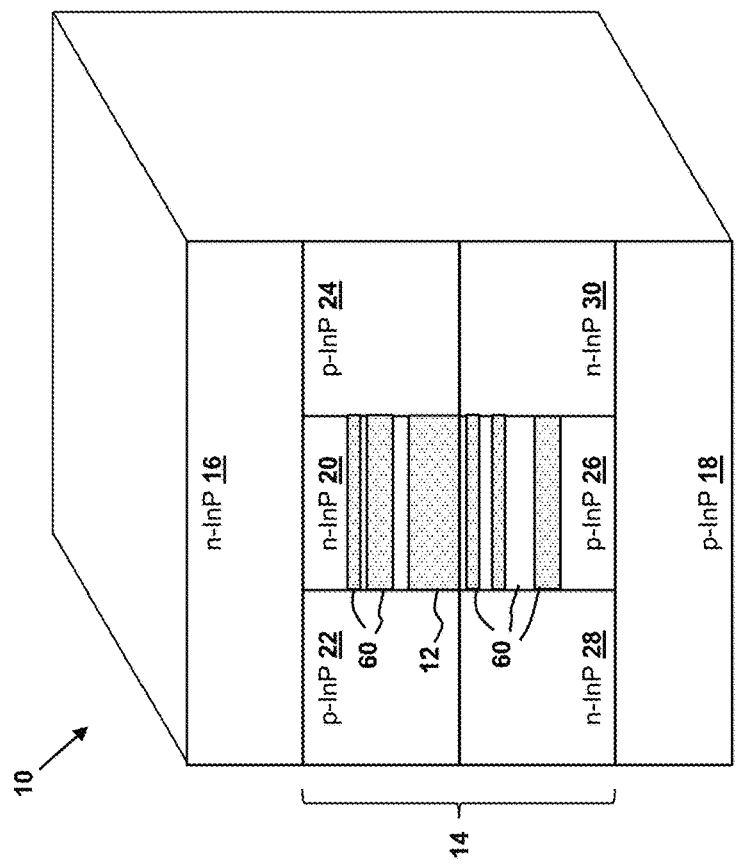
FIG. 21 depicts a cross-sectional view of the laser core and vertical confining features of FIG. 20 according to various embodiments of the disclosure.
Figure 20:
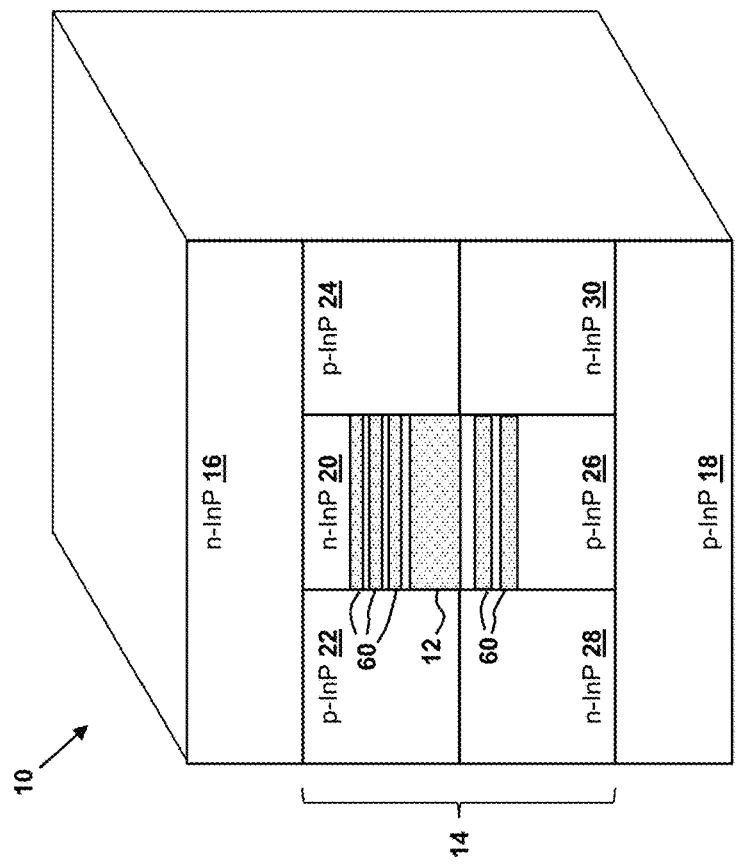
FIG. 20 depicts a cross-sectional view of another III-V semiconductor laser structure including vertical confining features according to various embodiments of the disclosure.

As depicted in FIGS. 18 and 19, vertical confining features 60 with the same width, but different heights $60H_1$, $60H_2$ may be formed in the n-doped section 20 above the laser core 12. As further depicted in FIGS. 20 and 21, the number, spacing, and/or height of the vertical confining features 60 formed above and below the laser core 12 may vary. In general, the number, spacing, placement, and/or configuration of the vertical confining features 60 relative to the laser core 12 may vary according to application and may be modified as necessary to address laser mode mismatch.

An illustrative process for forming a III-V laser 10 with side confining features 40 is depicted in FIGS. 22-28.

Figure 23:
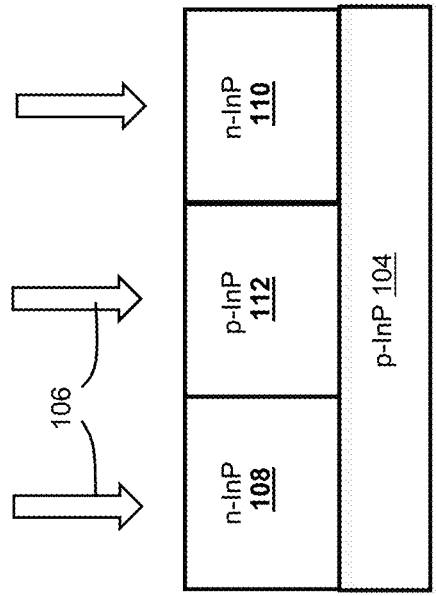
FIGS. 22-28 depict cross-sectional views of processes for forming a III-V semiconductor laser structure with side confining features according to various embodiments of the disclosure.
Figure 22:
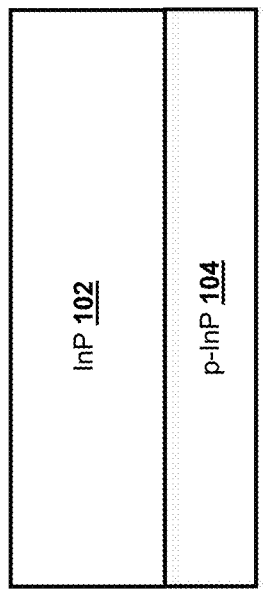

FIG. 22 depicts a semiconductor substrate 100 that includes an undoped layer 102 of indium phosphide (InP) overlaying a p-doped layer 104 of InP. As shown in FIG. 23, one or more doping processes 106 (e.g., ion implantation) may be performed to form an n-doped section 108 of InP, an n-doped section 110 of InP, and a p-doped section 112 of InP between the n-doped sections 108, 110 of InP. After the doping, as depicted in FIG. 24, a layer 114 of InGaAsP may be formed (e.g., via epitaxy) atop the doped sections 108, 110, 112 of InP.

Figure 25:
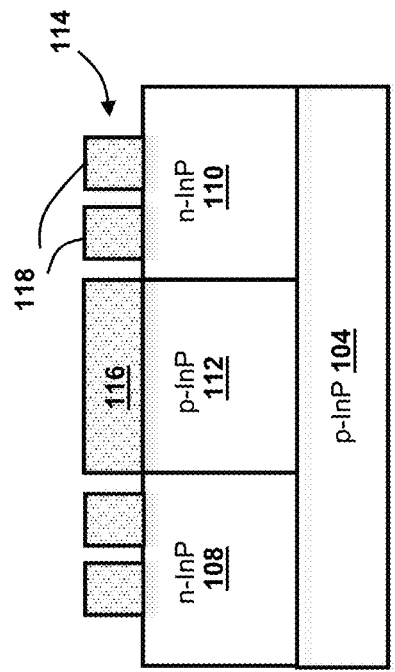
Figure 24:
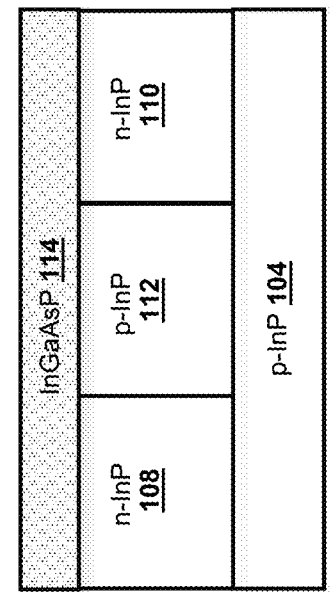

FIG. 25 depicts the structure of FIG. 24 after one or more masking/etching steps have been performed to selectively remove portions of the layer 114 of InGaAsP. Comparing FIG. 25 to FIG. 1, it can be seen that the remaining portion 116 of the layer 114 of InGaAsP corresponds to the laser core 12 and the remaining portions 118 of the layer 114 of InGaAsP corresponds to the side confining features 40 of the III-V laser 10 depicted in FIG. 1.

Figure 27:
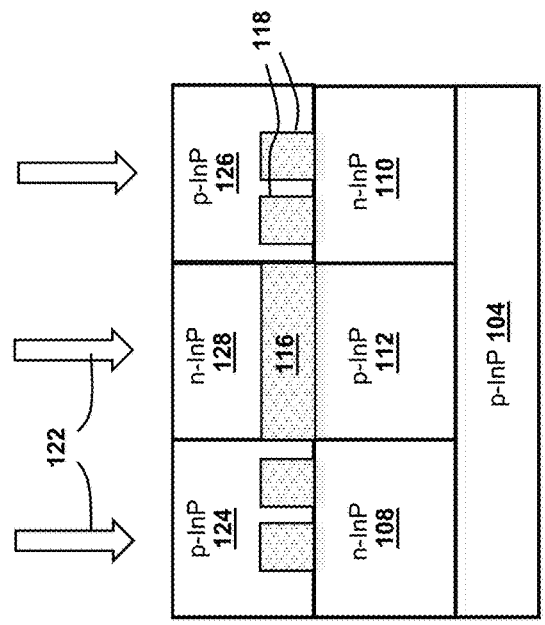
Figure 26:
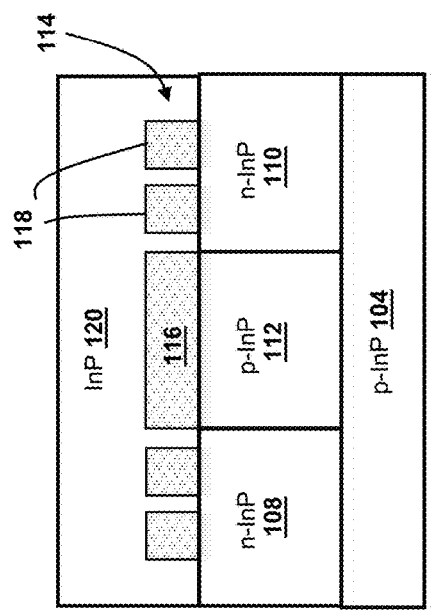
Figure 28:
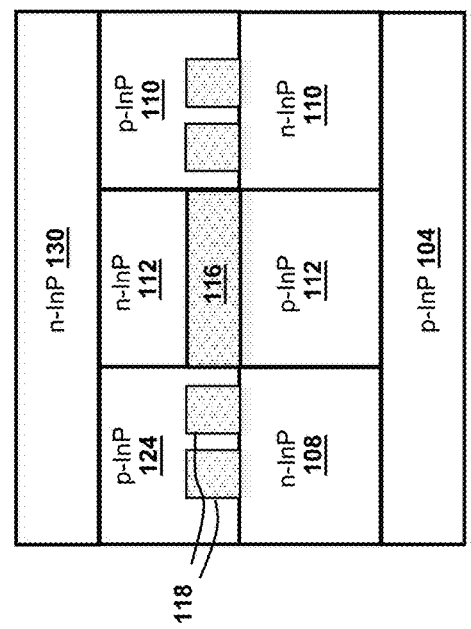

FIG. 26 depicts the structure of FIG. 25 after an undoped layer 120 of indium phosphide (InP) has been formed (e.g., by epitaxy) over the remaining portions 116, 118 of the layer 114 of InGaAsP and over the doped sections 108, 110, 112 of InP. As shown in FIG. 27, one or more doping processes 122 (e.g., ion implantation) may be performed to form a p-doped section 124 of InP, a p-doped section 126 of InP, and an n-doped section 128 of InP between the p-doped sections 124, 126 of InP. FIG. 28 depicts the structure of FIG. 27 after an n-doped layer 130 of InP has been formed over the doped sections 124, 126, 128 of InP.

An illustrative process for forming a III-V laser 10 with vertical confining features 60 is depicted in FIGS. 29-33.

Figure 29:
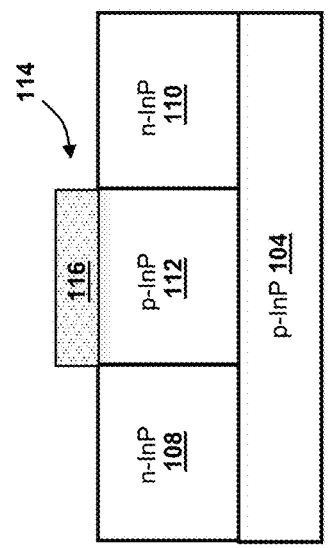

FIG. 29 depicts the structure of FIG. 24 after one or more masking/etching steps have been performed to selectively remove portions of the layer 114 of InGaAsP. Comparing FIG. 29 to FIG. 1, it can be seen that the remaining portion 116 of the layer 114 of InGaAsP corresponds to the laser core 12 of the III-V laser 10.

Figure 30:
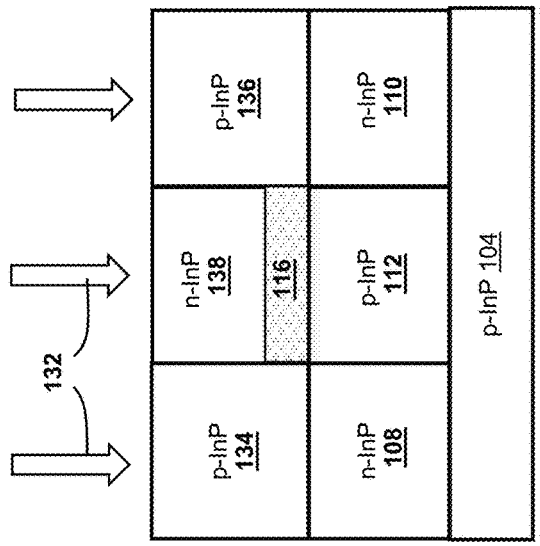
FIGS. 29-33 depict cross-sectional views of processes for forming a III-V semiconductor laser structure with vertical confining features according to various embodiments of the disclosure.

FIG. 30 depicts the structure of FIG. 29 after an undoped layer (not shown) of InP has been formed (e.g., by epitaxy) over the remaining portion 116 of the layer 114 of InGaAsP and over the doped sections 108, 110, 112 of InP and subsequently doped via one or more doping processes 132 (e.g., ion implantation). This step forms a p-doped section 134 of InP, a p-doped section 136 of InP, and an n-doped section 138 of InP between the p-doped sections 134, 136 of InP.

Figure 31:
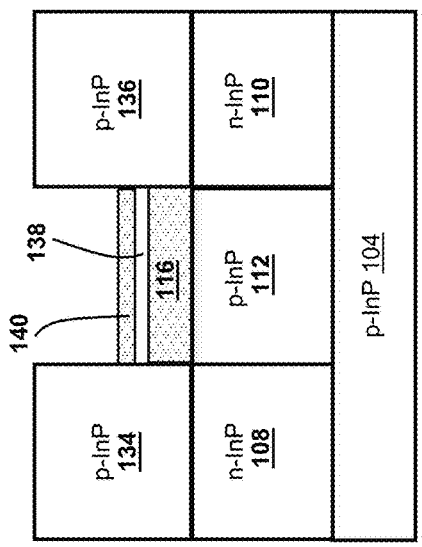

FIG. 31 depicts the structure of FIG. 30 after several additional processes have been performed. One or more masking/etching steps have been performed to selectively remove a portion of the n-doped section 138 of InP. A layer 140 of InGaAsP was then formed (e.g., via epitaxy) over the remaining n-doped section 138 of InP.

Figure 32:
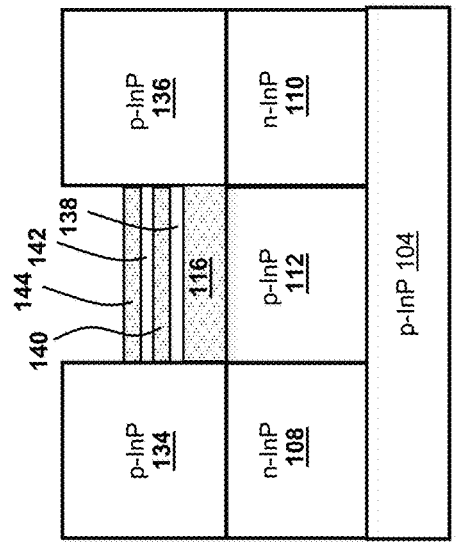

FIG. 32 depicts the structure of FIG. 31 after several additional processes have been performed. After forming a layer 142 of n-doped InP over the layer 140 of InGaAsP, another layer 144 of InGaAsP has been formed over the layer 142 of n-doped InP.

Figure 33:
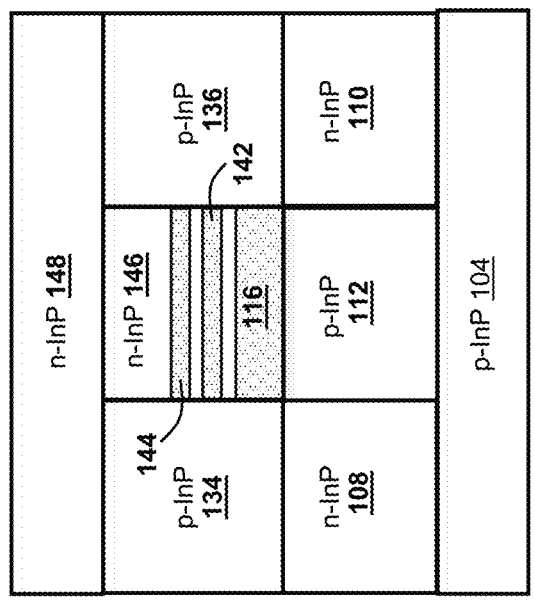

FIG. 33 depicts the structure of FIG. 32 after several additional processes have been performed. After forming a layer 146 of n-doped InP over the layer 144 of InGaAsP, a layer 148 of n-doped InP has been formed over the doped sections 134, 136, 146. Comparing FIG. 33 to FIG. 12, it can be seen that the remaining portion 116 of the layer 114 of InGaAsP corresponds to the laser core 12 and the layers 142, 144 of InGaAsP corresponds to the vertical confining features 60 of the III-V laser 10 depicted in FIG. 12.

The use of side confining features and/or vertical confining features in a III-V laser increases the coupling efficiency between the III-V laser and a waveguide of a photonic integrated circuit (e.g., an inverse tapered Si waveguide of an Si-based photonic integrated circuit). The side confining features and/or vertical confining features may be selectively configured as necessary to adjust the mode size of the III-V laser (e.g., along a lateral direction) to better match the mode size of the waveguide, leading to improved coupling efficiency.

The method as described above is used in the fabrication of photonic integrated circuit (PIC) chips. The resulting PIC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the disclosure. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

The invention claimed is:

1. A laser structure, comprising:
   a matrix formed of a first material;
   a laser source formed within the matrix and comprising a second, different material; and
   a plurality of side confining features formed within the matrix and extending parallel to and along a length of the laser source, the plurality of side confining features comprising the second material.

2. The laser structure of claim 1, wherein the first material has a refractive index lower than a refractive index of the second material.

3. The laser structure of claim 1, wherein the first material comprises a dielectric material.

4. The laser structure of claim 1, wherein the second material comprises a III-V semiconductor material.

5. The laser structure of claim 4, wherein the second material comprises indium gallium arsenide phosphide (InGaAsP), and wherein the first material comprises indium phosphide (InP).

6. The laser structure of claim 1, wherein the plurality of side confining features comprises:
   a first set of side confining features formed within the matrix and extending parallel to and along a length of a first side of the laser source; and
   a second set of side confining features formed within the matrix and extending parallel to and along a length of a second, opposite side of the laser source.

7. The laser structure of claim 6, wherein the first set of side confining features and the second set of side confining features are arranged symmetrically relative to the laser source.

8. The laser structure of claim 6, wherein the first set of side confining features and the second set of side confining features are arranged asymmetrically relative to the laser source.

9. The laser structure of claim 1, wherein the laser source is formed in a region of the matrix of a first doping type and wherein the plurality of side confining features are formed in regions of the matrix of a second doping type.

10. A laser structure, comprising:
    a matrix formed of a first material;
    a laser source formed within the matrix and comprising a second, different material; and
    a plurality of vertical confining features formed within the matrix and extending parallel to and along a length of the laser source, the plurality of vertical confining features comprising the second material.

11. The laser structure of claim 10, wherein the first material has a refractive index lower than a refractive index of the second material.

12. The laser structure of claim 10, wherein the second material is a III-V semiconductor material.

13. The laser structure of claim 12, wherein the second material comprises indium gallium arsenide phosphide (InGaAsP), and wherein the first material comprises indium phosphide (InP).

14. The laser structure of claim 10, wherein the plurality of vertical confining features are formed in the matrix as one of:
    vertically above the laser source;
    vertically below the laser source; and
    vertically above and below the laser source.

15. The laser structure of claim 14, wherein the plurality of vertical confining features are arranged symmetrically relative to the laser source.

16. The laser structure of claim 14, wherein the plurality of vertical confining features are arranged asymmetrically relative to the laser source.

17. The laser structure of claim 10, wherein the laser source is formed in a region of the matrix of a first doping type and wherein at least a portion of the plurality of vertical confining features are formed in one or more regions of the matrix of a second doping type.

18. A laser system, comprising:
    a laser source; and
    a waveguide optically coupled to the laser source,
    wherein the laser source comprises:
      a matrix formed of a first material;
      a laser source formed within the matrix and comprising a second, different material; and
      a plurality of confining features formed within the matrix and extending parallel to and along a length of the laser source, the plurality of confining features comprising the second material, wherein the plurality of confining features are formed on at least one of a plurality of sides, a top, and a bottom of the laser source, and wherein the plurality of confining features are configured to adjust a size and profile of a mode of the laser source to match a mode of the waveguide.

19. The laser system of claim 18, wherein the plurality of confining features are arranged symmetrically relative to the laser source.

20. The laser system of claim 18, wherein the first material has a refractive index lower than a refractive index of the second material.

* * * * *